United States Patent [19]

Ibaraki et al.

[11] Patent Number: 5,142,756

[45] Date of Patent: Sep. 1, 1992

[54] APPARATUS FOR LOADING AND RE-SLICING SEMICONDUCTOR WAFER

[75] Inventors: Tadashi Ibaraki; Tsutomu Sato, both of Niigata, Japan

[73] Assignee: Naoetsu Electronics Company, Niigata, Japan

[21] Appl. No.: 599,861

[22] Filed: Oct. 19, 1990

[30] Foreign Application Priority Data

Oct. 31, 1989 [JP] Japan .................................. 1-285287

[51] Int. Cl.$^5$ .......................... B24B 7/00; B24B 7/20; B28D 1/04

[52] U.S. Cl. .................................. 29/25.01; 51/73 R; 51/5 B; 51/215 UE; 125/13.02

[58] Field of Search ................ 437/226; 148/DIG. 28; 156/254; 428/64, 428; 83/23, 27, 102; 29/25.01; 294/64.1; 51/5 R, 5 B, 73 R, 215 UE; 125/13.01, 13.02

[56] References Cited

U.S. PATENT DOCUMENTS

| | | | |
|---|---|---|---|
| 4,261,781 | 4/1981 | Edmonds et al. | 156/254 |
| 4,420,909 | 12/1983 | Steere, Jr. | 51/73 R |
| 4,771,759 | 9/1988 | Zoebeli | 125/13.01 |
| 4,852,304 | 8/1989 | Honda et al. | 125/13.01 |
| 4,899,719 | 2/1990 | Abe et al. | 125/14 |

FOREIGN PATENT DOCUMENTS

| | | |
|---|---|---|
| 64-19729 | 1/1989 | Japan . |
| 1-293613 | 11/1989 | Japan . |
| 2-10727 | 1/1990 | Japan . |

OTHER PUBLICATIONS

English Translation of Claims 1 & 2 of Publication No. 64-19729.

English Translation of Claims 1 & 2 of Publication No. 1-293613.

Primary Examiner—Olik Chaudhuri
Assistant Examiner—David E. Graybill
Attorney, Agent, or Firm—Sandler, Greenblum, & Bernstein

[57] ABSTRACT

The present invention is directed to an apparatus for loading an unprocessed semiconductor wafer which is doped in advance with impurity diffusion layers on both sides or not doped, re-slicing the wafer and unloading two sheets of the re-sliced wafer as processed wafers upon completion of re-slicing the unprocessed wafer into two sheets to a recovery wafer magazine as a total system. More particularly, the present invention provides an improved loading and unloading mechanism arranged between a storage space of both unprocessed and processed wafers and a re-slicing mechanism, with chucking mechanisms and wafer magazines in the storage space. The loading and unloading mechanism includes a loading manipulator and an unloading manipulator, wherein the loading manipulator receives an unprocessed wafer from the storage space and then conveys and loads the wafer on a chucking mechanism which is operated in combination with a re-slicing mechanism, and then the unloading manipulator recovers two sheets of re-sliced wafers from the chucking mechanism and further unloads them into another wafer magazine. While the unloading manipulator is unloading the two sheets of re-sliced wafers into the magazine, simultaneously the loading manipulator will take out a new unprocessed wafer, wherein the new wafer is conveyed to a stand-by position and awaits until the completion of re-slicing an earlier wafer on the chucking mechanism.

5 Claims, 4 Drawing Sheets

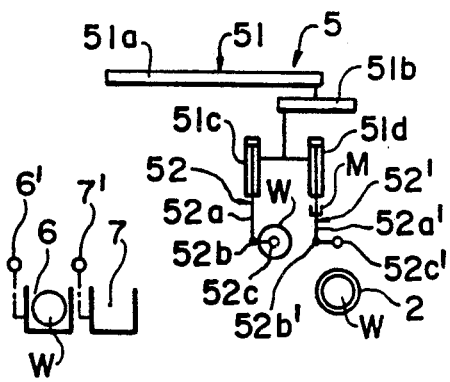
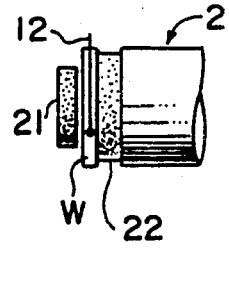
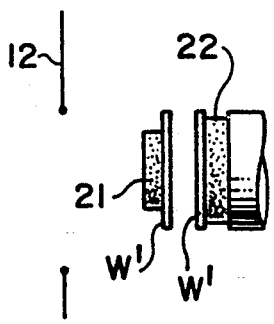
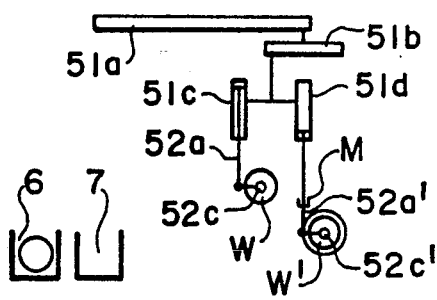
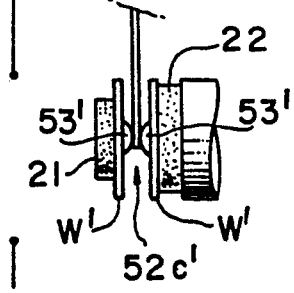
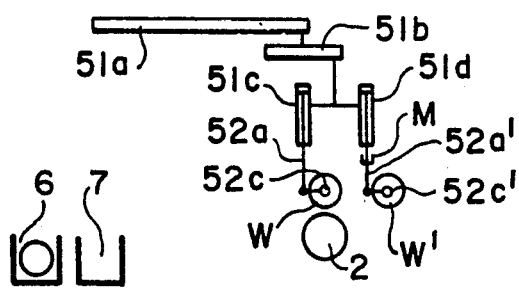
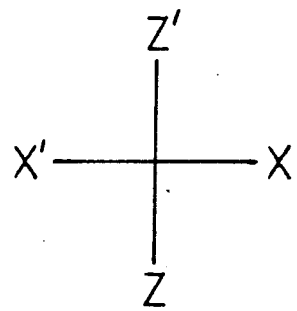
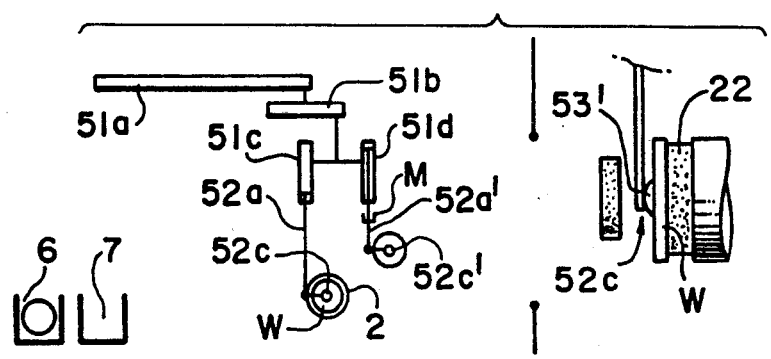

FIG. 2E₁

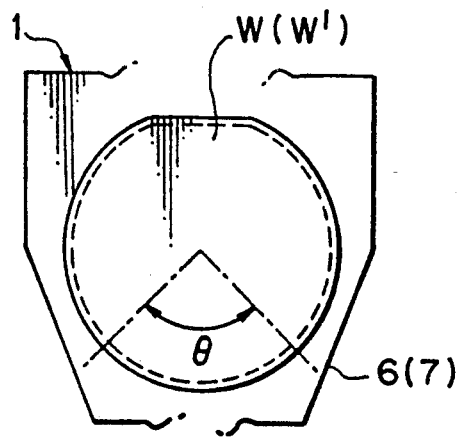
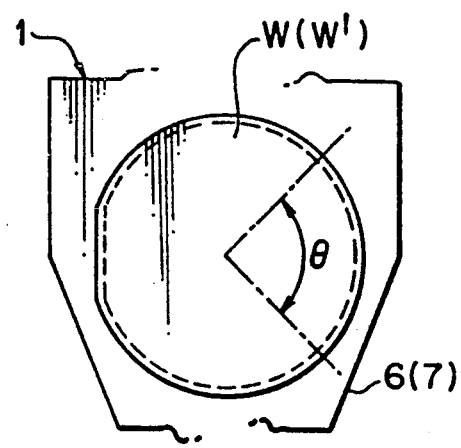
FIG. 3A     FIG. 3B
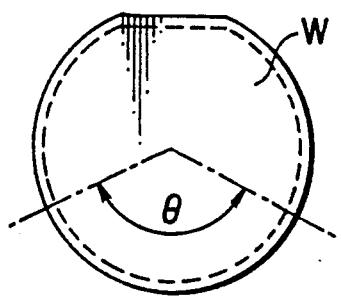
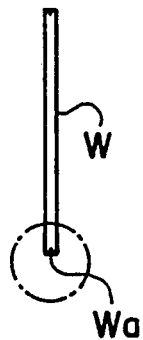
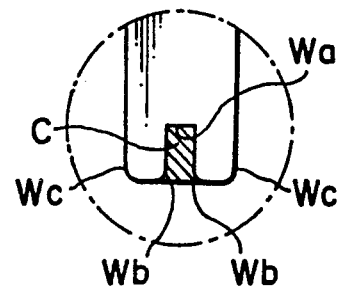
FIG. 4A     FIG. 4B     FIG. 4C
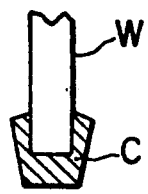
FIG. 5

APPARATUS FOR LOADING AND RE-SLICING SEMICONDUCTOR WAFER

BACKGROUND OF THE INVENTION

1. Field of the Invention

The present invention relates to an apparatus for re-slicing a semiconductor wafer, particularly for re-slicing the semiconductor wafer from its periphery edge into two sheets through the center portion of the core thickness of the semiconductor wafer to obtain thinner sheets, and more particularly to an improvement in loading an unprocessed wafer on a re-slicing machine and unloading the processed wafer from the same machine.

2. Description of the Prior Art

Japanese Patent Provisional Publication No.Sho 64-19729 and Japanese Patent Provisional Publication No.Hei 1-293613 disclose the processes of dividing a semiconductor wafer into two sheets, which are made of single crystal silicon, for making substrates for discrete components to be used for transistors, diodes or the like. In order to avoid the waste of costly raw material such as the single crystal silicon, a semiconductor wafer is re-sliced into two further sheets from the center of core thickness so that two sheets of substrates for the discrete components are simultaneously obtained.

U.S. Pat. No. 4,261,781 discloses a process for re-slicing a semiconductor wafer into two sheets. However, this patent is not directed to a process for making a substrate for a discrete component. In general, however, not only this U.S. patent document but also the other patent documents disclosed above, do not set forth an apparatus for a re-slicing process in cooperation with a loading and unloading apparatus.

On the other hand, the Applicant of the present invention has disclosed in Japanese Patent Provisional Publication No.Hei 2-10727, published on Jan. 16, 1990, a process for re-slicing a semiconductor wafer and an apparatus for loading an unprocessed wafer on a re-slicing machine and then unloading the processed wafer from the re-slicing machine.

Generally, a requirement for such an apparatus for re-slicing semiconductor wafers is to provide the following apparatus since conventional wafers are handled one by one. Such apparatus should include:

(a) A loading mechanism to load an unprocessed semiconductor wafer on a re-slicing machine;

(b) A slicing mechanism to re-slice the above unprocessed wafer which has been loaded by the above loading mechanism; and (c) An unloading mechanism to unload the processed wafer from the re-slicing machine in which it has been re-sliced by the above slicing mechanism.

Conventionally, since it is time-consuming to load and unload the semiconductor wafer as positioned as described in the above paragraphs (a) and (c) (other than paragraph (b)) by using conventional re-slicing systems, it is necessary to improve the total productivity relating to paragraphs (a) and (c). In other words, it is necessary to speed up the loading and unloading steps of the semiconductor wafer onto and from a slicing machine. However, the above apparatus involves disadvantages since the semiconductor wafer is easily breakable due to the thin shape and breakable properties, and may therefore break upon speeding up of the loading of the semiconductor wafer.

SUMMARY OF THE INVENTION

An object of the present invention is to provide a re-slicing apparatus capable of improving the total efficiency of the re-slicing process including the loading of semiconductor wafers without any damage from chipping of the semiconductor wafers during the re-slicing process in order to solve the aforementioned disadvantages.

It is a more specific object of the present invention to provide an apparatus for re-slicing semiconductor wafers, which comprises:

a re-slicing mechanism to re-slice an unprocessed semiconductor wafer into two sheets through substantially the center portion of the core thickness of the wafer by a slicing saw such as ID saw driven vertically at high speed;

a chucking mechanism to hold an unprocessed wafer from a loader prior to the re-slicing process and capable of still holding both wafers which have been re-sliced into two sheets, in a stand-by position, after the re-slicing process and until they are delivered by an unloader;

a longitudinal feeder mechanism to cooperate with the chucking mechanism for longitudinally positioning the wafer at a correct position in the re-slicing process against the blade edge of the ID saw, so as to longitudinally move the feeder forwardly or backwardly;

a lateral feeder mechanism provided to cooperate also with the chucking mechanism for laterally feeding the wafer into the blade edge of the ID saw while laterally moving the wafer, so as to re-slice the wafer into two sheets by the ID saw; and a loading and unloading mechanism positioned at a middle position between a storage space of unprocessed and processed wafers, and the chucking mechanism, which is provided to load the unprocessed wafer from the wafer magazine onto the chucking mechanism and then to unload the processed wafer from the chucking mechanism to another wafer magazine for loading the processed wafer.

The chucking mechanism is further provided with a holding means including a pair of vacuum chucks which are opposed separately with a clearance between both vacuum chucks. The clearance is adjustable between both vacuum chucks, and one chuck is fixed with the chucking mechanism body and the other chuck is detachably movable toward the fixed chuck along an axis, wherein they are operated so that the fixed chuck will hold the inside surface of an unprocessed wafer and the other movable chuck will hold the outside surface of the wafer from the outer position, so as to hold the outside wafer which has been separated by the re-slicing process. Both wafers are held separately by retracting one of the chucks backwardly and holding the other chuck temporarily, wherein the interval of the space between both chucks is widened for the subsequent insertion of the unloader into the space.

The longitudinal and lateral feeder mechanisms further operate the chucking mechanism for longitudinally and laterally positioning the wafer held at the correct position in the re-slicing process, i.e., at the center of the core thickness of the wafer, wherein they are operated to efficiently re-slice the wafer.

The loading and unloading mechanisms are further synchronized with the re-slicing process, wherein they are operated to transfer the processed wafer into a wafer magazine for processed wafers, and an unprocessed wafer is taken out from the other wafer magazine for unprocessed wafers to be transferred to a stand-by position to the re-slicing mechanism during the re-slicing process of the earlier wafer which is loaded on the chucking mechanism.

The loading and unloading mechanisms are further provided with a pair of loaders having respective vacuum cups. The loader in charge of only unloading has double vacuum cups which are positioned back to back so as to hold two sheets of wafers oppositely during the re-slicing process. The other loader in charge of only loading has a single vacuum cup so as to hold and load an unprocessed wafer on the chucking mechanism. These loaders are equipped with a gantry crane type conveyer, which overlies and extends between the re-slicing mechanism and the storage space of both wafer magazines.

The wafer magazines include an unprocessed wafer magazine for feeding an unprocessed wafer to the loader and a recovery magazine for recovering a processed wafer from an unloader. Both magazines are adjacent and in parallel and are installed on a feeder mechanism capable of feeding each magazine separately with one pitch of the row between wafers loaded in the magazine, so as to be synchronized with the respective working pace of the loading and unloading steps.

The preferred embodiment of the present invention is advantageous for the following reasons:

The present invention is advantageous in that it comprises a re-slicing mechanism provided with an ID saw which is mounted upright and driven at high speed so as to re-slice an unprocessed semiconductor wafer into two sheets through substantially the center of the core thickness of the wafer.

A chucking mechanism, including a pair of vacuum chucks with a space between both vacuum chucks, allows the insertion of a loader of the unprocessed wafers and an unloader of the processed wafers, respectively, into the space. One chuck comprises a fixed type vacuum chuck fixed with the mechanism body, which is capable of holding the inside of the unprocessed wafer throughout the re-slicing process of the unprocessed wafer. The other chuck comprises a movable type vacuum chuck which is movable later than the first chuck for holding the outside of the unprocessed wafer to be re-sliced into two sheets by the ID saw according to the progress of the re-slicing process.

A longitudinal feeder mechanism is provided with an automatic thickness control to feed and then position the chucking mechanism together with the unprocessed wafer horizontally at the correct position capable of re-slicing the center of the core thickness of the wafer held on the one vacuum chuck against the blade edge of the ID saw.

A lateral feeder mechanism is provided to feed the chucking mechanism in a lateral direction along the horizontal or vertical direction so as to re-slice the wafer by means of the stationary ID saw after the determination of being positioned at the correct position for re-slicing the wafer.

A loading and unloading mechanism is arranged between the chucking mechanism and a storage space for storing the unprocessed and processed wafer magazines, which are provided to load a sheet of the unprocessed wafer on the chucking mechanism through conveying devices from the storage space of the unprocessed wafers which are contained in a wafer magazine, and to unloaded the two sheets of processed wafers upon completion of the re-slicing process from the chucking mechanism into another wafer magazine provided in the storage space through the conveying devices. The loading mechanism further is provided to convey the unprocessed wafer to a stand-by position which is the nearest position for the chucking mechanism to await until the completion of re-slicing an earlier wafer on the chucking mechanism.

A storage space for storing a pair of wafer magazines comprises an unprocessed wafer magazine to load in advance a plurality of the unprocessed wafers within the magazine, and a processed wafer magazine to unload two sheets of the processed wafers into the processed wafer magazine from an unloading manipulator of the loading and unloading mechanism.

The present invention is further advantageous in that the chucking mechanism includes a pair of oppositely arranged vacuum chucks with an adjustable space between them. The loading and unloading mechanism includes a loading manipulator having a single vacuum cup on the end thereof and an unloading manipulator having double vacuum cups on the end thereof, wherein the chucking mechanism will receive an unprocessed semiconductor wafer from the loading manipulator and then hold it by one of the vacuum chucks. The other vacuum chuck will then hold the opposite side of the unprocessed wafer just before the completion of re-slicing of the unprocessed wafer so as to continuously hold one half of the re-sliced wafer by actuating a holding function thereof. Furthermore, the pair of vacuum chucks of the chucking mechanism will be able to maintain a predetermined distance for the space between them so as to be able to deliver two sheets of the re-sliced wafers simultaneously into the space between the double vacuum cups of the unloading manipulator.

The present invention is also advantageous in that the chucking mechanism comprises a pair of vacuum chucks which are opposed with a space between both vacuum chucks. The space is adjustable between both vacuum chucks, and one chuck is fixed with the longitudinal feeder and the other chuck is detachably movable toward the fixed chuck along an axis. When they are operated, the fixed chuck will hold the inside surface of an unprocessed wafer firstly, and the other movable chuck will then hold the outside surface of the wafer from the outer position, so as to hold the outside wafer according to the progress of the re-slicing process, wherein both wafers are separately held by the pair of vacuum chucks within the space for the insertion of the unloader.

The present invention is still further advantageous in that the loading and unloading mechanism comprises a storage space comprising both an unprocessed wafer magazine and a processed wafer magazine which are parallel with each other. These wafer magazines further comprise a feeder mechanism to feed the magazines intermittently along their longitudinal direction with a respective predetermined one pitch according to their loading and unloading operation in cooperation with the loading and unloading mechanism, which is capable of operating vertically in the range of the storage space.

The present invention is also advantageous in that the loading and unloading mechanism incorporates the loading system of an unprocessed wafer with the unloading system of a processed wafer, wherein they are adjacently placed in a common system.

The present invention is still more advantageous in that the unprocessed wafer includes a semiconductor wafer for manufacturing a substrate to be used for discrete components and further comprises a processed wafer doped in advance with impurity diffusion layers on both sides thereof without any impurity diffusion layer in the inside of the plane core portion thereof.

Thus, in accordance with the present invention, the total time consumption of the above various processes can be reduced by allowing the re-slicing, loading and unloading processes to proceed simultaneously by the synchronized operation of the loading and unloading mechanism, and further making the chucking mechanism perform the inherent function of holding an unprocessed wafer without any damage, such as chipping off, as well as by making the loading and unloading mechanism stay at a stand-by position which is apart from the re-slicing mechanism for facilitating the secure handling of the unprocessed wafer. It is therefore advantageous in that it can perform the re-slicing process efficiently without any damage of the wafer, whereby it can reduce the production cost of re-slicing the wafer.

Further, in accordance with the present invention, the apparatus can unload the two sheets of processed wafers easily and securely by making possible the adjustment of the space between the oppositely spaced vacuum chucks, whereby it can further improve the above mentioned effects.

Still further, the present invention can simplify the structure of the loading and unloading mechanism, whereby it can minimize the occupation area of installing the system.

Finally, to the present invention can produce a substrate for discrete components effectively at an optimum production cost.

BRIEF DESCRIPTION OF THE DRAWINGS

FIG. 2(A)-2(J), 2A1, 2A2, 2B1, and 2E1 are a series of side views schematically illustrating the movements of the loading and unloading mechanisms;

FIG. 3(A) and 3(B) are schematic section views illustrating the sections of wafer magazines for loading unprocessed and processed wafers respectively;

FIG. 4(A) is a front view illustrating a constructional example of a semiconductor wafer to be processed by the re-slicing mechanism of the present invention;

FIG. 4(B) is a side view of FIG. 4(A);

FIG. 4(C) is a partially enlarged section view of FIG. 4(B); and

FIG. 5 is a section view illustrating a constructional example of semiconductor wafer to be processed according to the present invention.

DESCRIPTION OF THE PREFERRED EMBODIMENT

Figure 1B:
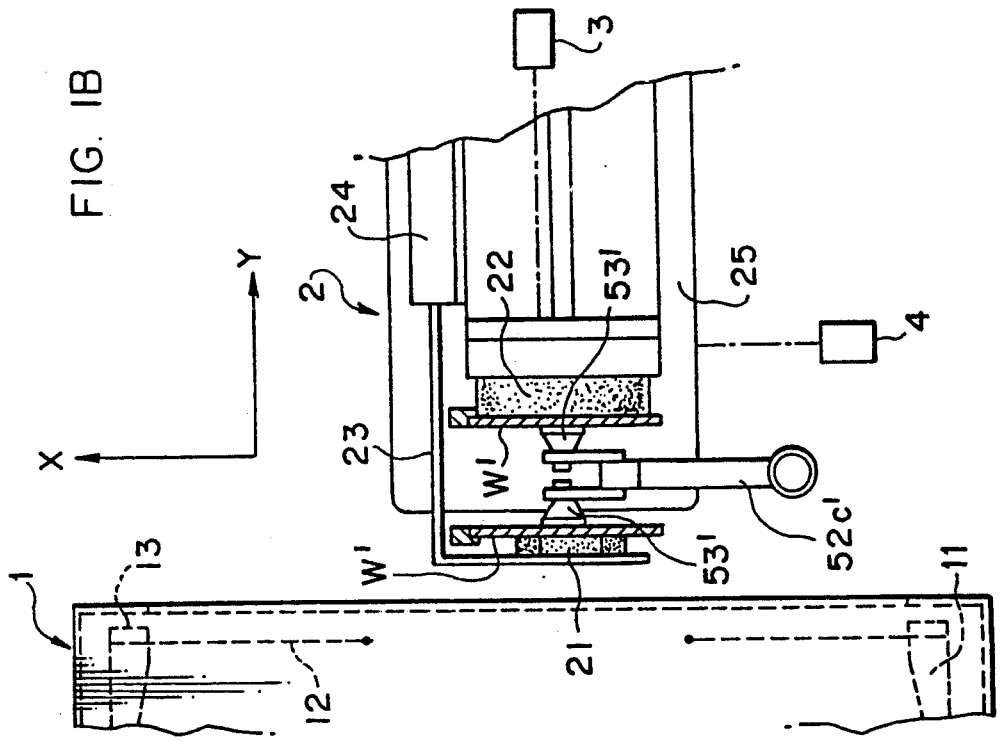
FIG. 1(B) is a schematic plan view partially illustrating an example upon completion of re-slicing process.

Referring now in detail, the preferred embodiment of the present invention is described in the drawings as follows:

In FIG. 1 and FIG. 2, a practical example of the present invention is shown as a horizontal-type system which is capable of saving space of the system in both the longitudinal and lateral directions. As shown in FIG. 1(B), the Y-axis illustrates a longitudinal direction and the X-axis illustrates an axis substantially perpendicular thereto. As shown in FIG. 2(C), the Z,Z' axis illustrates vertical directions and X,X' illustrates the lateral direction. Directions X and Z are the directions approaching the chucking mechanism and X' and Z' are the directions leading from the chucking mechanism. The system comprises a re-slicing mechanism 1; chucking mechanisms 2 which act in cooperation with the re-slicing process, the loading, and unloading processes of unprocessed and processed semiconductor wafers; longitudinal and lateral feeder mechanism 3, 4 which act to feed the chucking mechanism 2 for positioning a work piece held on the chucking mechanism 2; and loading and unloading mechanisms 5 which serve for loading and unloading the work piece.

The re-slicing mechanism 1 comprises an ID saw 12, which is known as a doughnut-shaped thin blade bonded with abrasive grains such as diamond grains, a ring shaped tension member 13, which tensions the ID blade mechanically, and tension head 11, which is rotated at high speed through a shaft driven by a motor.

Figure 1A:
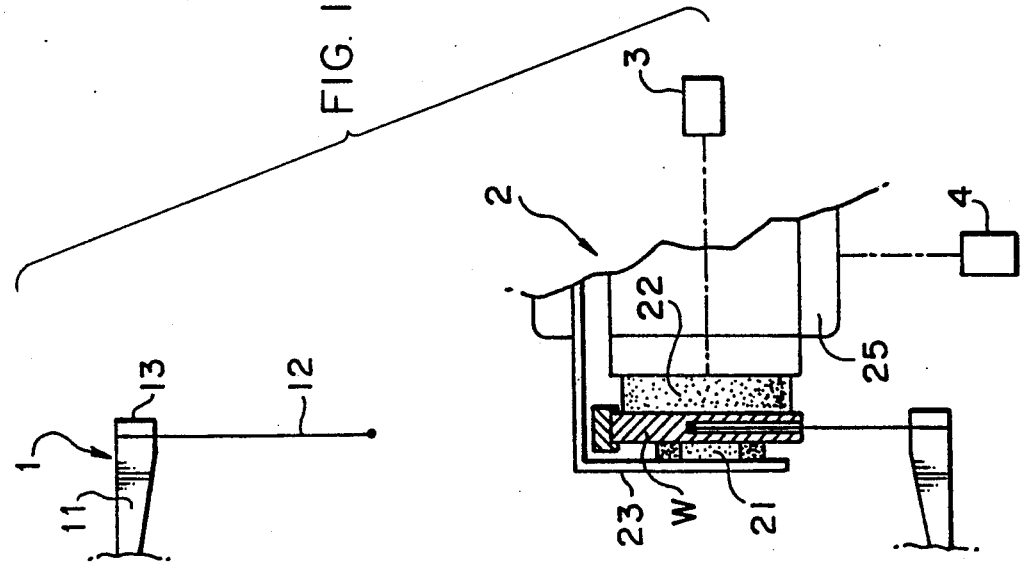
FIG. 1(A) is a schematic plan view partially illustrating an example of an apparatus such as a re-slicing mechanism, a chucking mechanism and other operations for re-slicing a semiconductor wafer according to the present invention.

It is preferred that the blade surface of ID saw 12 be vertical so as to re-slice an unprocessed semiconductor wafer into two sheets through substantially the center portion of the core thickness as shown in FIG. 1(A).

Chucking mechanism 2 comprises a pair of vacuum chucks, such as the inside chuck 22 and the outside chuck 21, which are opposed separately with a clearance between both vacuum chucks. The clearance is adjustable by an L-shaped rod 23 fixed with the outside chuck 21 and driven by a clearance adjusting drive source 24, such as an air cylinder, servomotor or the like. Vacuum chucks 22, 21 are formed of an air permeable porous-construction material and sealingly communicate with a vacuum pump (not shown in the drawings) so as to cause a strong vacuum action over all the surface of vacuum chucks 22, 21 to attract a semiconductor wafer with the vacuum surface of the inside chuck 22 or the surface of the outside chuck 21. Chucking mechanisms 2 further provide an element 25 through a longitudinal feeder mechanism 3 to feed the chucking mechanism 2 itself toward the re-slicing mechanism 1 together with the held semiconductor wafer.

With respect to the operation of the vacuum chucks 22, 21 of the chucking mechanism 2, the vacuum chucks 22, 21 are operated to load an unprocessed wafer and then unload the processed wafer after the re-slicing. In the loading step of the unprocessed wafer, it is only possible to load and hold the wafer on the inside chuck 22 and further unload the wafer from the chuck 22 when the outside chuck 21 is separated from the inside chuck 22 with a maximum clearance between them other than during the re-slicing operation.

With respect to the re-slicing operation of the unprocessed wafer held on the inside chuck 22, this operation is characterized in that the re-slicing work for the unprocessed wafer is done by the holding by the inside chuck 22 only during half of the re-slicing operation; however, in the last stage of the re-slicing operation or just before the completion of re-slicing work at the latest, the outside chuck 21 will move inwardly to hold the outside surface of the unprocessed wafer so as to carefully approach to hold such a thin wafer from outside. That is, now both sides of the wafer are held between the inside chuck 22 and outside chuck 21 accordingly in order to continuously hold both wafers which have been re-sliced from one sheet of an unprocessed wafer into two sheets of processed wafers upon the completion of the re-slicing operation.

Longitudinal feeder mechanism 3, for positioning the chucking mechanism 2 with an unprocessed wafer against the ID saw, comprises a driving mechanism which is driven by a servomotor or the like (not shown in the drawings) and an automatic thickness controller (not shown in the drawings).

The above driving mechanism is directed to feed and position an unprocessed wafer held with the inside chuck 22 of the chucking mechanism 2 at the right position for re-slicing the unprocessed wafer from substantially the center portion of core thickness of the wafer against the active blade edge of ID saw 12 in cooperation with the mechanism, and then is driven to retract the processed wafers which have been re-sliced into two sheets and held by both chucks 22, 21 for unloading two sheets of the wafers so as to avoid the re-slicing mechanism 1 as shown in FIG. 1(B).

Lateral feeder mechanism 4 comprises a servo-motor or the like, which is operated upon the completion of positioning at the right position for re-slicing the wafer against the ID saw by the above longitudinal feeder mechanism. The lateral feeder mechanism 4 feeds the chucking mechanism 2 together with the unprocessed wafer laterally so as to re-slice the wafer into two sheets at the right position or it may optionally be moved vertically. As a requirement of this step, the operation of the above longitudinal feeder mechanism 3 is prohibited while the lateral feeder mechanism 4 is under operation by using an interlock-circuit in the controller to switch each operation between the longitudinal and lateral feeders mechanism 3, 4 respectively.

The loading and unloading mechanism 5 is illustrated in FIG. 2(A) in detail. FIG. 2(A) is a side view schematically illustrating the configuration of loading and unloading mechanism 5 in rotation to the storage space of wafer magazines 6, 7 and the chucking mechanism 2 for the unprocessed wafer W in the storage space. One magazine is loaded with a plurality of unprocessed wafers W, which are shown upright in side view in FIG. 2(A), and the other magazine 7 is now shown as empty in FIG. 2(A) but later receives processed wafers W' as shown in FIG. 2(H).

The loading and unloading mechanism 5 is illustrated schematically in FIG. 2(A) as a gantry crane type conveyer extending over and between the storage space of wafer magazines 6, 7 and the chucking mechanism with unprocessed wafer W so as to initially take out an unprocessed wafer W from wafer magazine 6. Wafer W is lifted up, and then conveyed laterally while hanging down from a main conveyer 51a toward the upper portion of the chucking mechanism 2 in order to descend and load the unprocessed wafer W on the inside chuck 22. Upon the completion of re-slicing the wafer W, i.e., two sheets of wafers W', these wafers W' are sent back along the above described course in reverse, which is the concept of the loading and unloading mechanism 5.

The construction of the loading and unloading mechanism 5 comprises a conveyer portion 51, a main conveyer 51a, a subconveyer 51b, and H-shaped loaders including a loading manipulator 51c and unloading manipulator 51d. This combination of loading and unloading manipulators 51c, 51d operates to immediately load an unprocessed wafer, which is in the stand-by position upon the completion of unloading the two sheets of the processed wafers W' through the function of the unloading manipulator 51d by shifting the stand-by position of the unprocessed wafer W to the loading position of the wafer W on the inside chuck 22. The shifting movement between the loading and unloading manipulators 51c, 51d is operated by the sub-conveyer 51b.

The loading manipulator 51c further includes an arm portion which is operated up and down, a hinge arm 52a with a pivot portion 52b, which is operated by a rotary actuator or the like, and a single vacuum cup 52c, which is operated by a rotary actuator or the like, and a single vacuum cup 52c, which is provided on the end portion of the hinge arm 52a to be capable of attracting and holding an unprocessed wafer W by pneumatic vacuum action.

The unloading manipulator 51d further includes an arm portion 52', which is operated up and down, a hinge arm 52a with a pivot portion 52b' which is operated by a rotary actuator or the like, a servo-motor M provided along the same axis as the hinge arm 52a' to rotate the arm 52a' through a 180° angle, and double vacuum cups 52c provided on the end portion of the hinge 51a to be capable of attracting and holding the two sheets of processed wafers W' by pneumatic vacuum action. The hinge arms 52a, 52a' operate to orientate the slice base portion of an unprocessed wafer at the last position of the re-slicing process when the wafer is re-sliced by the ID saw by bending up the hinge arms to an L-shape from the half way positions of the arms. Regarding the necessity of the rotary solenoid type motor, since two sheets of processed wafers W' are simultaneously unloaded by the double vacuum cups 52c', 52c' of the unloading manipulator 51d, with both plane re-sliced surfaces being face to face, it is necessary to unload the two sheets of the wafers W' into the wafer magazine 7 in the same direction but not face to face. Therefore, one sheet of wafer W' is unloaded first and then the other wafer is lifted up and turned around through a 180° angle so as to be in the same direction with the earlier wafer W' in the wafer magazine 7.

Magazines 6, 7 each comprise a rack type magazine having a plurality of vertical grooves in both interior walls of the magazine body for receiving both side periphery edges of the semiconductor wafers along the vertical grooves in both interior walls and at a predetermined pitch. The respective magazine is mounted on a feeder 6', 7' which is driven by a step motor or the like, wherein the magazine is fed at a predetermined pitch so as to be synchronized with a working pace of loading and unloading the unprocessed and processed semiconductor wafers W, W'.

Referring now in detail to the operation of the loading and unloading mechanism 5, the re-slicing process of the semiconductor wafer is illustrated in the series of FIG. 2(A) to FIG. 2(J) as follows:

1) FIG. 2(A) illustrates the loading and unloading mechanism 5 being in a stand-by position, wherein the sub-conveyer 51b is positioned at the most right side of the main conveyer 51a through a hanging rod. H-shaped loading and unloading manipulators 51c, 51d are positioned at the most left side of the sub-conveyer 51b through a hanging rod fixed between these manipulators 51c, 51d, and an unprocessed wafer is held in a stand-by position by the single vacuum cup 52c of the hinge arm 52a, which is bent in an L-shape. Thus, when the unprocessed wafer W is in the stand by position as described above, on the other hand an earlier unprocessed wafer W is under the operation of re-slicing process by the re-slicing mechanism 2 as illustrated in FIG. 2(A), which is illustrated as a plan view so as to facilitate the understanding of the re-slicing process as simultaneous proceeding together with the loading and unloading processes.

As described previously, the re-slicing process of the earlier wafer W is commenced by holding the wafer on the inside chuck 22; however, to approach the last stage of the re-slicing process, the other chuck, i.e., the outside chuck 21, will move inwardly to hold the opposite side of the wafer in order to be prepared when the wafer has been completely re-sliced. Upon the completion of this re-slicing process, the outside chuck 21 is again moved back to the outside while holding one of processed wafer W' as shown in FIG. 2(A$_2$) so as to provide a necessary space between both wafers W, W' in order to allow the insertion of the double vacuum cups 52c'.

2) FIG. 2(B) illustrates the hinge arm 52a' descending into the enlarged space between both chucks 22, 21 to receive the two sheets of processed wafers W',W' simultaneously by using the double vacuum cups 52c' from these chucks 22, 21 as shown in FIG. 2(B$_1$).

3) FIG. 2(C) illustrates the unloading manipulator 51d pulling up the hinge arm 52a together with the two sheets of the processed wafers W', W' and the sub-conveyer 51b moves the hanging rod of the manipulators 51c, 51d to the most right side. According to this movement of the manipulators 51c, 51d to the right side, a next unprocessed wafer has been positioned at the nearest position to the inside chuck 22 of the chucking mechanism 2 which is now empty.

4) FIG. 2(D) illustrates the hinge arm 52a being kept intact in the paragraph 3) position, together with two sheets of the processed wafers W', W' and the other hinge arm 52a of the loading manipulator 51c, descends into the space which is still enlarged between both chucks 22, 21, which are all empty, to load one sheet of the unprocessed wafer W on the inside chuck 21 while bending up the hinge arm 52a into an L-shape as shown in FIG. 2(D).

Figure 2E:
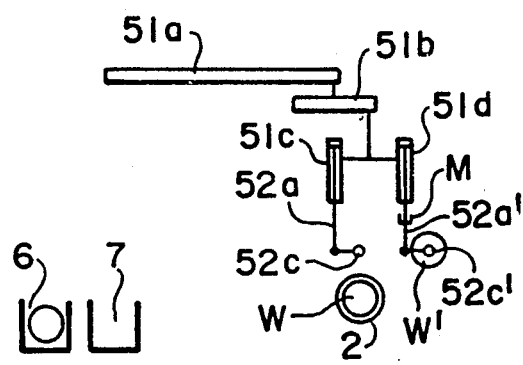

5) FIG. 2(E) illustrates the loading manipulator 51c pulling up the hinge arm 52a to the same level with the other hinge arm 52a'. On the other hand, the chucking mechanism starts to be fed by the horizontal feeder mechanism 3 (see FIGS. 1(A) and 1(B) for positioning at the correct position for re-slicing the unprocessed wafer W through substantially the center portion of core thickness of the wafer W in cooperation with an automatic thickness control. Upon the decision of the right positioning, the horizontal feeder mechanism 3 is locked and the vertical feeder mechanism 4 operates chucking mechanism 2 to re-slice the wafer (see FIGS. 1(A) and 1(B).

Figure 2F:
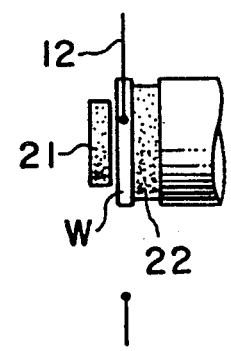
Figure 2F:
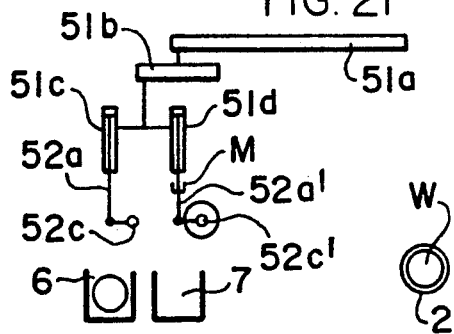

6) FIG. 2(F) illustrates the main conveyer 51a moving the hanging rod of the manipulators 51c, 51d to the leftmost side to be above the storage space of the wafer magazines 6, 7 of the unprocessed and processed wafers.

Figure 2G:
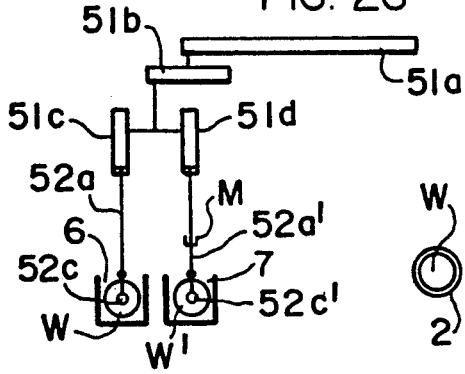
Figure 2H:
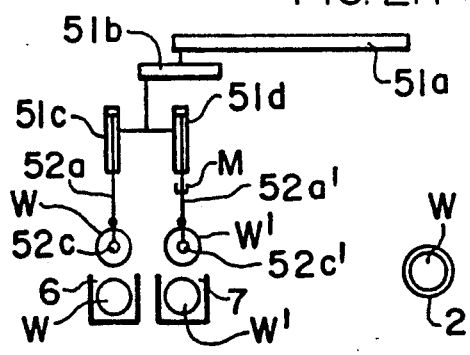

7) FIG. 2(G) illustrates both hinge arms 52a, 52a being straightened out downwardly and then descending together into both wafer magazines 6, 7. In the first stroke, the single vacuum cup 52c catches a new unprocessed wafer W from the wafer magazine 6, and the double vacuum cups 52c release one of the two sheets of processed wafers W', W' into wafer magazine 7.

8) FIG. 2(H) illustrates both manipulators 51c, 51d, pulling up their hinge arms 52a, 52a' simultaneously together with the new unprocessed wafer W, on the single vacuum cup 52c and the remainder piece of processed wafer W' on the double vacuum cups 52c.

Figure 2I:
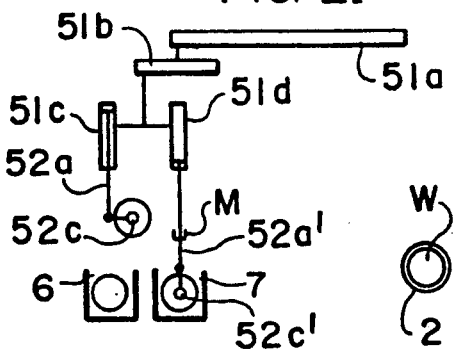

9) FIG. 2(I) illustrates that first the processed wafer magazine 7 is mechanically fed by one pitch along the Y-axis, for receiving the remaining processed wafers W', i.e., the longitudinal direction of wafer magazine 7'(see FIG. 2(A)) by the feeder 7', while hinge arms 52a 52a' are lifted in the paragraph 8) step. Second, only the hinge arm 52a' is rotated through a 180° angle by operating the motor for making the facing direction of the remaining wafer W' the same as the first wafer W' which was loaded into the wafer magazine, and then the hinge arm 52a is further lowered to release the remaining wafers W' from the double vacuum cups 52c' into the processed wafer magazine 7. Third, the other hinge arm 52a is bent up again as an L-shape together with the new unprocessed wafer W.

Figure 2J:
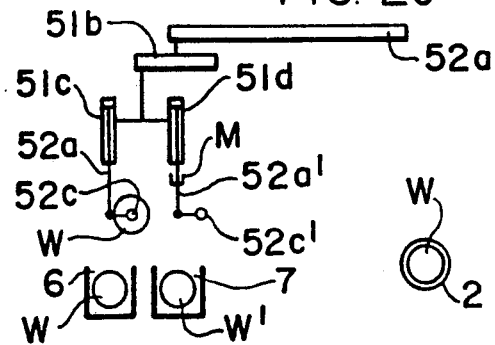

10) FIG. 2(J) illustrates the hinge arm 52a' being lifted up and bent up as an L-shape. Both wafer magazines 6, 7 are fed at one pitch respectively along the y-axis direction for the preparation of further loading and unloading steps. After that, manipulators 51c, 51c' are further moved to the stand-by position upon the chucking mechanism 2 as illustrated in the paragraph 1) step. Then, these 10 steps from 1 to 10 are repeated continuously.

FIGS. 3, 4, and 5 illustrate a relationship between an unprocessed semiconductor wafer W with a slice base or a processed semiconductor wafer W' and wafer magazines 6, 7.

According to the prior art disclosed previously in the description of the present invention, it is known that it is advantageous to mount a thin slice base in advance on the periphery edge of an unprocessed wafer one by one before the re-slicing process of the unprocessed semiconductor wafer in order to prevent the wafer's edge from any chipping off damage during the re-slicing process by a slicing machine.

In view of the advantage of preparing the slice base mounted in advance on the periphery edge of a semiconductor wafer, the semiconductor wafer used in the present invention is adapted with the slice base as is usual. Thus FIGS. 3(A), 3(B) and 4 illustrate an angle range for mounting the slice base on the wafer edge in accordance with the known art. FIGS. 3(A) and 3(B) further show a plurality of unprocessed or processed wafers W or W' having flat portions, such as an orientation flat on the upper or left side of the wafer W, or W'. These wafers are loaded in wafer magazines 6 or 7 in the storage space.

As a modification of mounting the slice base on the wafer edge, in FIGS. 4(A), 4(B) and 4(C), the present invention suggests that a continuous slit Wa or groove is carved in advance along all of the circumference of unprocessed wafer W with an approximately 1 mm depth and a width being wider than the blade core thickness of the ID saw 12. Then, a quick solidifying type adhesive C is filled into the continuous slit Wa or groove as a substitute for a slice base. In this modification, it is further suggested to chamfer both corner edges Wc, Wc of the bottom surface of the unprocessed wafer and also the corner edges Wb, Wb of the opening portion of the continuous slit Wa, since the slit corner chamfer edges Wb facilitate the filling of the adhesive C into the slit, and the bottom corner chamfer edges Wc are effective to handle the wafer during the processes before and after the re-slicing process.

FIG. 5 illustrates a mold type slice base C being formed as a C-shape so as to cover the end of the semiconductor wafer W by molding an adhesive material C simultaneously on a wafer edge. This is useful to prevent the wafer edge from chipping off damage during the re-slicing process, as provided in earlier application Ser. No. 07/590,806 by the Applicant of the present invention.

This invention is not limited to the above illustrated preferred embodiment, for example, the above preferred embodiment can be modified in that the main conveyer 51a may use a rodless cylinder; however, it may also use a stepping motor or the like. Further, it can incorporate the main conveyer 51a with the sub-conveyer 51b. In other words, the main conveyer 51a can be modified to be usable without any sub-conveyer 51b by providing a special type rodless cylinder capable of stopping the movement of the main conveyer 51a sensitively at any position, so as to be usable as a substitute for the sub-conveyer 51b; that is, there is not any definite reason that this invention must use two conveyors such as the main and subconveyers 51a, 51b separately.

As another option, the above illustrated preferred embodiment is described as the chucking mechanism 2 with an unprocessed wafer W being fed against the re-slicing mechanism, i.e., ID saw, by using the lateral feeder mechanism 4, however, it may be possible to feed the re-slicing mechanism 1 itself and not the chucking mechanism.

Regarding further modifications for the hinge arms 52a, 52a' with pivot portions 52b, 52b' of the loading and unloading mechanism 5 of the present invention illustrated in the above preferred embodiment, basically this hinge arm rotation of a 90° angle is only to load an unprocessed wafer on the inside chuck 22 of the chucking mechanism 2 so as to face the orientation flat portion of the unprocessed wafer W upwardly to allow the wafer W to be started to be re-sliced first by the ID saw and then finished at the slice base portion as marked θ by in FIG. 3(A); however, this feature only depends on the initial loading direction of the unprocessed wafers into wafer magazine 6 in the storage space. In other words, in this embodiment, it is only necessary that initially the plurality of unprocessed wafers W were loaded in the wafer magazine 6 so as to face the orientation flat portion to the right side and to face the slice base to left side, therefore, it was required to rotate the wafer in a counterclockwise direction at a 90° angle.

In view of the above situation, the loading direction of the plurality of unprocessed wafers W in the wafer magazine 6 can be modified so as to face the orientation flat portion upwardly as illustrated in FIG. 3(A) in case of vertical re-slicing or FIG. 3(B) in case of lateral re-slicing. As the result of this modification of wafer loading direction, the loading and unloading manipulators 51c, 51d' can be modified to be only straight without the hinge arms 52a, 521a' with the pivot portions 52b, 52b' in the present invention although the hinge arm is advantageous for reducing the total height of the whole system.

The invention may be embodied in other specific forms without departing from the spirit or essential characteristics thereof. The present embodiment is therefore to be considered in all respects as illustrative and not restrictive, the scope of the invention being indicated by the appended claims rather than by the foregoing description and all changes which come within the meaning and range of equivalency of the claims are therefore intended to be embraced therein.

What is claimed is:

1. An apparatus for loading and re-slicing a semiconductor wafer having a core, said apparatus having longitudinal and lateral directions, said apparatus comprising:
    a re-slicing mechanism provided with an ID saw driven vertically at high speed so as to re-slice an unprocessed semiconductor wafer into two sheets through substantially the center portion of the core thickness of said wafer;
    a chucking mechanism provided to hold an unprocessed wafer vertically while said unprocessed wafer is subsequently re-sliced by said re-slicing mechanism
    a longitudinal feeder mechanism provided to feed said chucking mechanism with said unprocessed wafer in said longitudinal direction so as to bring said wafer center portion to a correct position of a blade edge, and then further to retract said chucking mechanism with processed wafers upon the completion of a re-slicing process;
    a lateral feeder mechanism provided to feed one of said chucking mechanism with said unprocessed wafer or said re-slicing mechanism in a lateral or vertical direction selectively for re-slicing said wafer center portion by the blade of said ID saw;
    a loading and unloading mechanism for loading and unloading said unprocessed and processed wafers between an unprocessed wafer storage portion and a processed wafer recovery portion;
    said longitudinal feeder mechanism further provided to feed said chucking mechanism with said unprocessed wafer so as to further position substantially the center portion of the core thickness of said wafer against the blade edge of said ID saw;
    said chucking mechanism further provided to hold said unprocessed wafer at a position apart from the blade of said re-slicing mechanism, wherein said unprocessed wafer and processed wafers are movable between the position of said chucking mechanism and the position of said loading and unloading mechanism; and
    said loading and unloading mechanism operating to convey and deliver said processed wafers which are unloaded from said chucking mechanism to said processed wafer recovery portion during the re-slicing process of a subsequent wafer by said re-slicing mechanism, and sequentially to take up another new unprocessed wafer from said unprocessed wafer storage portion and to convey said unprocessed wafer to a stand-by position to wait at said stand-by position until said processed wafer has been unloaded form said chucking mechanism.

2. An apparatus for loading and re-slicing a semiconductor wafer according to claim 1, wherein said chucking mechanism includes a pair of oppositely positioned vacuum chucks with a space between said vacuum chucks and means for adjusting the distance of said space, said loading and unloading mechanism further including a loading manipulator having a single vacuum cup on an end thereof and an unloading manipulator having double vacuum cups positioned back to back on an end thereof, wherein said chucking mechanism will receive an unprocessed semiconductor wafer from said loading manipulator and then hold said unprocessed wafer by at least one of said vacuum chucks, the other said vacuum chuck holding the opposite side of said unprocessed wafer just before the completion of re-slicing said unprocessed wafer, the pair of vacuum chucks of said chucking mechanism being able to maintain a predetermined distance of said space between them so as to be able to deliver two sheets of said re-sliced wafers simultaneously to said double vacuum cups of said unloading manipulator, said two sheets having been inserted into said space between the pair of said vacuum chucks of said chucking mechanism.

3. An apparatus for loading and re-slicing a semiconductor wafer according to claim 1, wherein a storage space comprises both an unprocessed wafer magazine and a processed wafer magazine which are in parallel with each other, said wafer magazines further comprising a feeder mechanism to feed said wafer magazines intermittently along their longitudinal direction by a respective one pitch during the loading and unloading operation in cooperation with said loading and unloading mechanism, said loading and unloading mechanism performing loading and unloading operations vertically in a range of said storage space.

4. An apparatus for loading and re-slicing a semiconductor wafer according to claim 1, wherein said loading and unloading mechanism is provided to cooperate with both a loading system for said unprocessed wafer and an unloading system for said processed wafer as a common system.

5. An apparatus for loading and re-slicing a semiconductor wafer according to claim 1, wherein said unprocessed wafer comprises a semiconductor wafer having a plane core portion, for manufacturing a substrate to be used for discrete components, and further comprising a processed wafer being doped in advance with impurity diffusion layers on both sides thereof without any impurity diffusion layer in the inside of said plane core portion.

* * * * *